US012699382B2

(12) United States Patent
Kim et al.

(10) Patent No.: US 12,699,382 B2
(45) Date of Patent: Aug. 4, 2026

(54) METHOD, APPARATUS, AND SYSTEM WITH ABNORMALITY DETERMINATION

(71) Applicant: SAMSUNG ELECTRONICS CO., LTD., Suwon-si (KR)

(72) Inventors: Keunseo Kim, Suwon-si (KR); Gyungmin Kim, Suwon-si (KR); Sangdo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 521 days.

(21) Appl. No.: 18/330,589

(22) Filed: Jun. 7, 2023

(65) Prior Publication Data

US 2024/0201673 A1 Jun. 20, 2024

(30) Foreign Application Priority Data

Dec. 19, 2022 (KR) ........................ 10-2022-0178665

(51) Int. Cl.
G05B 19/418 (2006.01)
G06T 7/00 (2017.01)
H10P 74/20 (2026.01)

(52) U.S. Cl.
CPC ........ G05B 19/41875 (2013.01); G06T 7/001 (2013.01); H10P 74/203 (2026.01);
(Continued)

(58) Field of Classification Search
CPC ...... G05B 19/41875; G05B 2219/2602; G05B 23/0275; G05B 23/0221; G05B 23/0243;
(Continued)

(56) References Cited

U.S. PATENT DOCUMENTS 11,029,359 B2 6/2021 Honda et al.
2019/0180152 A1* 6/2019 Krompaß ......... G05B 19/41875
(Continued)

FOREIGN PATENT DOCUMENTS

WO WO 2021/161423 A1 8/2021

OTHER PUBLICATIONS

Paper "Ada-boundary: accelerating DNN training via adaptive boundary batch selection", by Hwanjun Song et al., published in 2020, <online>, retrieved from <https://doi.org/10.1007/s10994-020-05903-6> (Year: 2020).*
(Continued)

*Primary Examiner* — Charles Cai
(74) *Attorney, Agent, or Firm* — NSIP Law

(57) ABSTRACT

A processor-implemented method of an apparatus or system includes obtaining an expert classification criterion from a memory of the apparatus or system; converting manufacturing process data associated with a manufacturing process to a test sample in a form of an image; generating, using a machine learning model provided the test sample, a probability value that the test sample corresponds to a target class representing an anomaly occurring in the manufacturing process; adjusting the probability value by reflecting the expert classification criterion for the anomaly; and identifying, by classifying the anomaly based on the adjusted probability value, whether a final abnormality in the manufacturing process has occurred.

20 Claims, 13 Drawing Sheets

700

(52) U.S. Cl.
CPC ................. *G05B 2219/2602* (2013.01); *G06T 2207/20081* (2013.01); *G06T 2207/20084* (2013.01)

(58) Field of Classification Search
CPC ....................... G05B 23/0256; G05B 23/0283; G06T 7/001; G06T 2207/20081; G06T 2207/20084; H01L 22/12; H01L 22/20; H01L 21/67253; G06N 20/10; Y02P 90/02
See application file for complete search history.

(56) References Cited

U.S. PATENT DOCUMENTS

| | | | |
|---|---|---|---|
| 2019/0277913 A1* | 9/2019 | Honda | ................. G06N 3/0499 |
| 2021/0082098 A1* | 3/2021 | Kumbhare | ............. G06T 7/001 |
| 2021/0142168 A1 | 5/2021 | Kushnir et al. | |
| 2021/0383530 A1* | 12/2021 | Peleg | .................... G06F 18/214 |
| 2022/0188707 A1 | 6/2022 | Kingetsu | |

OTHER PUBLICATIONS

Guo, Chuan, et al., "On Calibration of Modern Neural Networks," International Conference on Machine Learning, PMLR, 2017, (10 Pages in English).

Saqlain, Muhammad, et al., "A Deep Convolutional Neural Network for Wafer Defect Identification on An Imbalanced Dataset in Semiconductor Manufacturing Processes," IEEE Transactions on Semiconductor Manufacturing, vol. 33, No. 3, Aug. 4, 2020, (pp. 436-444).

Song, Hwanjun, et al., "Ada-Boundary: Accelerating DNN Training Via Adaptive Boundary Batch Selection," Machine Learning 109, Sep. 4, 2020, (pp. 1837-1853).

* cited by examiner

Decision boundary 205

Class 1: Hard sample 210     Easy sample 220

Class 2: Hard sample 230     Easy sample 240

600

700

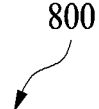
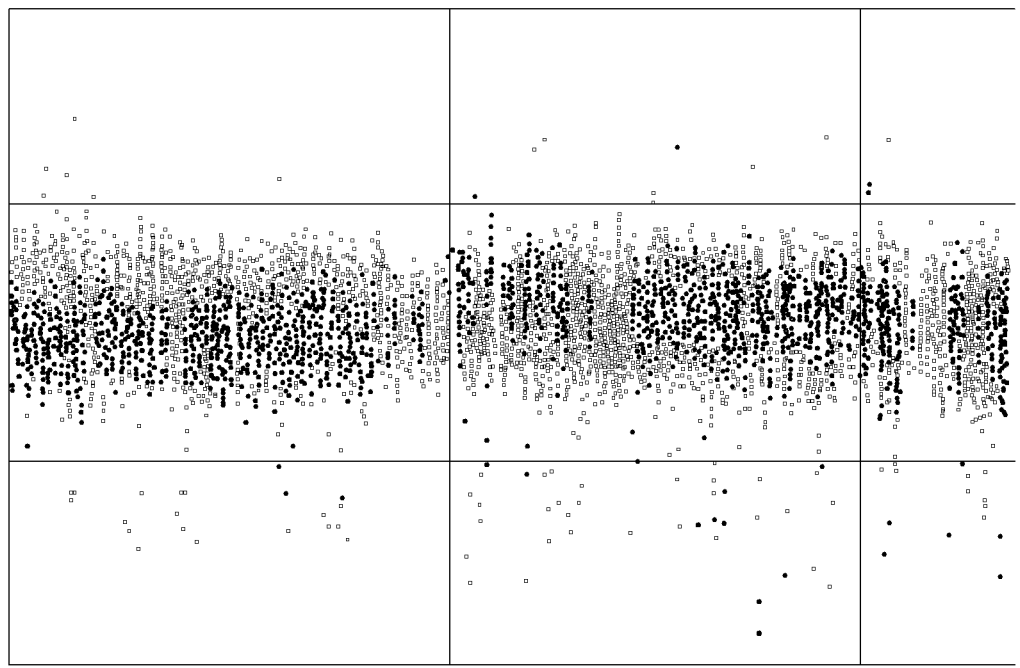
FIG. 8

900

☐MMAX[1]   ☑NML[q]   ☐NML E[0]

☐DEV1[2]   ☐DEV2[3]   ☐DEV3[4]   ☐NML V1[e]   ☐NML V2[t]   ☐NML V3[y]

☐DRIFT1[5]   ☐DRIFT2[6]   ☐DRIFT3[7]   ☐DRIFT4[8]   ☐NML F1[r]   ☐NML F2[z]

☐AVG1[9]   ☐AVG2[0]   ☐NML A1[x]   ☐NML A2[c]   ☐NML A3[f]   ☐NML A4[g]

Label vote :

☑Labeler 1[j]   ☑Labeler 2[k]   ☐Labeler 3[l]   ☐Labeler 4[h]   ☐Labeler 5[m]

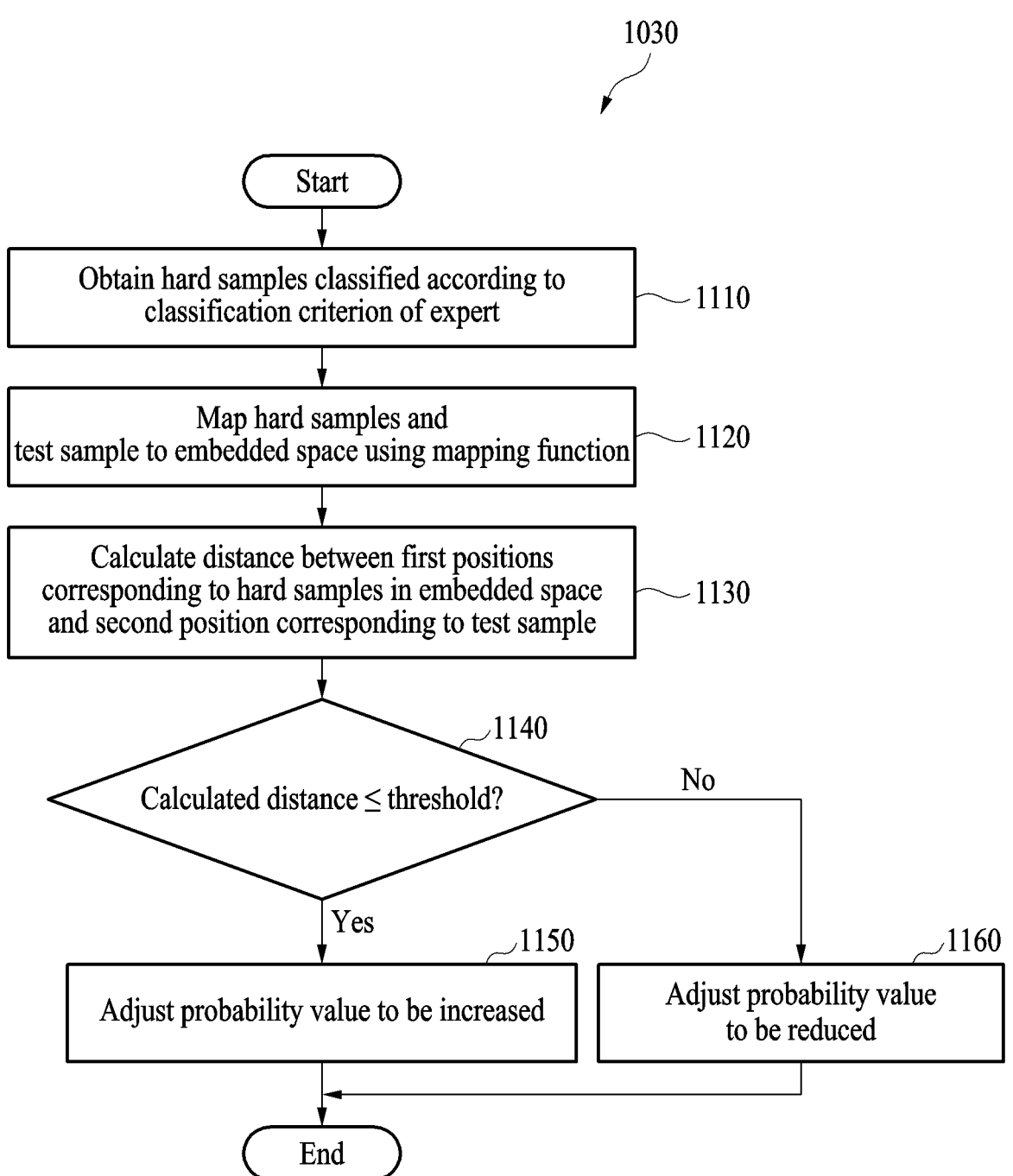

1030

Start

Obtain hard samples classified according to
classification criterion of expert ~1110

Map hard samples and
test sample to embedded space using mapping function ~1120

Calculate distance between first positions
corresponding to hard samples in embedded space
and second position corresponding to test sample ~1130

1140

Calculated distance ≤ threshold?

No

Yes

1150

Adjust probability value to be increased

1160

Adjust probability value
to be reduced

End

FIG. 11

METHOD, APPARATUS, AND SYSTEM WITH ABNORMALITY DETERMINATION

CROSS-REFERENCE TO RELATED APPLICATIONS

This application claims the benefit under 35 USC § 119(a) of Korean Patent Application No. 10-2022-0178665, filed on Dec. 19, 2022, in the Korean Intellectual Property Office, the entire disclosure of which is incorporated herein by reference for all purposes.

BACKGROUND

1. Field

The following disclosure relates to a method, apparatus, and system with abnormality determination.

2. Description of Related Art

Monitoring and/or analysis of a manufacturing process may be performed by engineers in relevant technical fields to determine in real time whether the process is performed normally. For example, when visually analyzing the manufacturing process, an engineer may not be able to manage all sensors of large-scale equipment (e.g., semiconductor equipment) and thus the efficiency may decrease. In addition, due to different abilities between engineers, it may be difficult to consistently determine whether an anomaly occurs in the manufacturing process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method of an apparatus or system may include obtaining an expert classification criterion from a memory of the apparatus or system; converting manufacturing process data associated with a manufacturing process to a test sample in a form of an image; generating, using a machine learning model provided the test sample, a probability value that the test sample corresponds to a target class representing an anomaly occurring in the manufacturing process; adjusting the probability value by reflecting the expert classification criterion for the anomaly; and identifying, by classifying the anomaly based on the adjusted probability value, whether a final abnormality in the manufacturing process has occurred.

The adjusting of the probability value may include adjusting the probability value based on respective distances in an embedded space between the test sample and hard samples classified according to the expert classification criterion.

The hard samples classified according to the expert classification criterion may be stored in advance.

The adjusting of the probability value may include mapping the hard samples and the test sample to the embedded space using a mapping function; and adjusting the probability value based on respective distances between first positions corresponding to the respective hard samples in the embedded space and a second position corresponding to the test sample.

The adjusting of the probability value may include adjusting a corresponding probability value such that the corresponding probability value increases, in response to a corresponding one of the distances being less than or equal to a threshold; and adjusting the corresponding probability value such that the corresponding probability value decreases, in response to the corresponding one of the distances being greater than the threshold.

The threshold may be adjustable according to difficulty in classifying the hard samples by the expert.

The machine learning model may be trained to predict the anomaly based on the manufacturing process data labeled with the target class.

The machine learning model may be trained based on at least one of: a first loss based on a distance between a training probability value corresponding to a training test sample in an embedded space and a set threshold; or a second loss based on cross entropy between the target class representing a training anomaly predicted by the in-training machine learning model and a ground truth class corresponding to the test sample.

The manufacturing process data may include at least one of sensing data, representing at least one of an operating state of manufacturing equipment, a phenomenon represented by the manufacturing equipment, or an output of the manufacturing equipment and which is generated in a process in which the manufacturing equipment performs the manufacturing process in time series; or virtual metrology data representing the manufacturing process.

The method may further include storing the classified anomaly of the manufacturing process data in the memory.

The machine learning model may include at least one of a support vector machine (SVM) or a neural network classifier.

The manufacturing process data may include semiconductor manufacturing process data from one or more of a thin film process of depositing a thin film, on which an electric circuit of a semiconductor device is to be printed, on a surface of a wafer; an implantation process of implanting a dopant into the deposited thin film; a diffusion process of applying heat to the implanted dopant such that the dopant is distributed on the thin film; a lithography process of coating a surface of the thin film with a photoresist to transfer a circuit pattern prefabricated on a reticle or mask to the surface of the thin film, performing an exposure to the photoresist applied onto the surface of the thin film, removing the exposed photoresist, and performing developing; an etching process of removing an exposed film using the photoresist remaining after the removing as a protective film; a cleaning process of removing the remaining photoresist and removing additionally formed foreign materials; a deposition process of forming a thick film to protect and insulate a circuit pattern of the electrical circuit; a planarization process of planarizing the deposited thick film; a metrology process of measuring at least one of a size of the circuit pattern, a thickness of the circuit pattern, or a dopant concentration; or an inspection process of inspecting particles and a pattern defect caused by a fault.

A non-transitory computer-readable storage medium storing instructions, when executed by one or more processors, may cause the one or more processors to perform the method described above.

In another general aspect, a processor-implemented method of an apparatus or system may include obtaining an expert classification criterion from a memory of the apparatus or system; converting manufacturing process data associated with a manufacturing process to a test sample in a form of an image; generating, using a machine learning model provided the test sample and based on the expert classification criterion for an anomaly in the manufacturing process, a probability value that the test sample corresponds to a target class representing the anomaly; and identifying, by classifying the anomaly based on the generated probability value, whether a final abnormality in the manufacturing process has occurred.

The machine learning model may be an in-training model, and the method may further include training the in-training model based on a first loss based on a distance between a probability value corresponding to the test sample in an embedded space and a set threshold; a second loss based on cross entropy between the target class representing the anomaly predicted by the machine learning model and a ground truth class corresponding to the test sample; and a third loss to force a first distance between the test sample and a hard negative sample having a class different from the target class corresponding to the test sample among samples included in the embedded space to be less than a second distance between the test sample and a random negative sample corresponding to one of hard samples classified according to the classification criterion of the expert.

In another general aspect, an apparatus may include one or more processors configured to convert manufacturing process data to a test sample in a form of an image; generate, using a machine learning model provided the test sample, a probability value that the test sample corresponds to a target class representing an anomaly occurring in the manufacturing process; adjust the probability value based on a classification criterion of an expert for the anomaly; and identify, by classifying the anomaly based on the adjusted probability value, whether the abnormality in the manufacturing process has occurred.

The one or more processors may be configured to adjust the probability value based on respective distances in an embedded space between the test sample and respective hard samples classified based on the classification criterion of the expert.

The apparatus may further include one or more memories configured to store at least one of the classified anomalies of the manufacturing process data or the hard samples classified based on the classification criterion of the expert.

The one or more processors may be configured to map the test sample to the embedded space using a mapping function; adjust the probability value such that the probability value increases, in response to a distance between a selected one of first positions corresponding to a selected one of the hard samples in the embedded space and a second position corresponding to the test sample being less than or equal to a threshold; and adjust the probability value such that the probability value decreases, in response to the distance being greater than the threshold.

The machine learning model may be trained to predict the anomaly based on the manufacturing process data labeled with the target class.

Other features and aspects will be apparent from the following detailed description, the drawings, and the claims.

BRIEF DESCRIPTION OF THE DRAWINGS

FIG. 8 illustrates an example conversion of manufacturing process data to a test sample according to one or more embodiments.

FIG. 11 illustrates an example method of adjusting a probability value according to one or more embodiments.

Figure 1:
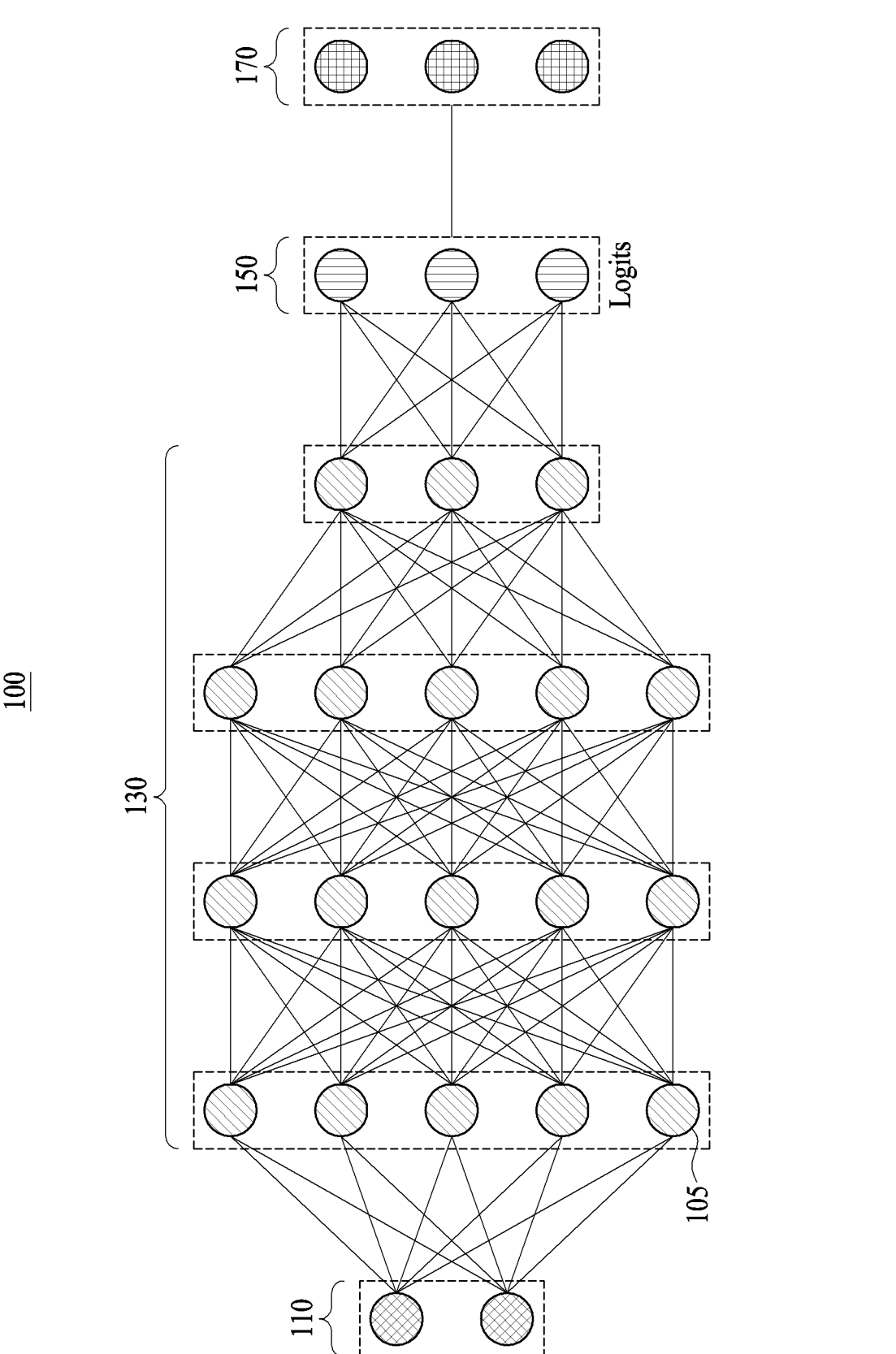
FIG. 1 illustrates an example machine learning model included in an apparatus with abnormality determination in a manufacturing process according to one or more embodiments.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

As used herein, the term "and/or" includes any one and any combination of any two or more of the associated listed items. The phrases "at least one of A, B, and C", "at least one of A, B, or C', and the like are intended to have disjunctive meanings, and these phrases "at least one of A, B, and C", "at least one of A, B, or C', and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing. It is to be understood that if a component (e.g., a first component) is referred to, with or without the term "operatively" or "communicatively," as "coupled with," "coupled to," "connected with," or "connected to" another component (e.g., a second component), it means that the component may be coupled with the other component directly (e.g., by wire), wirelessly, or via a third component.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

In various embodiments, machine learning models may be used to detect abnormalities in a manufacturing process. A typical neural network model fails to meet an engineer's professional judgment standards. Thus, while such a typical machine learning model may be used for some operations, human judgment is still required to complete the anomaly detection in a manufacturing process, i.e., an engineers' professional experiences and knowledge are still required due to a difficulty in accurately defining various anomalies occurring in a manufacturing process. Thus, it is found herein to be beneficial to use methods and apparatuses to make final determinations of abnormalities (e.g., without human input during the detection process) in a manufacturing process.

FIG. 1 illustrates an example machine learning model included in an apparatus with abnormality determination in a manufacturing process according to one or more embodiments. As shown in FIG. 1, a machine learning model may be a neural network 100.

The neural network 100 may include an input layer 110, a plurality of hidden layers 130, and an output layer 170. In one example, the last layer of the hidden layers 130 may correspond to a softmax layer 150.

The input layer 110, the respective hidden layers 130, and the softmax layer 150 may each include a plurality of nodes 105. In an example, the neural network 100 may further include an output layer 170. The neural network 100 includes edges (connection links) that connect the respective nodes. In the neural network 100, each of the nodes 105 may output respective function values of activation functions in response to respective inputs through the edge(s) and corresponding weights, and a bias. Nodes 105 of layers (e.g., the input layer 110, the hidden layers 130, and/or the softmax layer 150) other than the output layer 170 in the neural network 100 may be connected to nodes 105 of a next layer, as a non-limiting example, through edges for transmitting output signals. For example, the number of edges between adjacent layers, for a particular node 105 of the next layer, may correspond to the number of nodes 105 included in the previous layer.

The input layer 110 may receive a test sample in the form of an image, for example, and transfer the test sample to the hidden layer 130. The image may be captured by an image sensor (e.g., a camera) of the apparatus for determining the abnormalities in a manufacturing process, or received from a communication system from an image sensor exterior of the apparatus or an image sensor of the apparatus (or system).

An output of an activation function associated with weighted inputs of nodes 105 included in a previous layer may be input to each of nodes included in the hidden layers 130. The weighted inputs may be obtained by multiplying a weight by inputs of the nodes 105 included in the previous layer. The weight may also be referred to as a parameter of the neural network 100. As non-limiting examples, the activation function may include a sigmoid function, a hyperbolic tangent (tanh) function, or a rectified linear unit (ReLU) function, but is not limited thereto. Nonlinearity may be formed in the neural network 100 by the activation function.

In one example, the softmax layer 150, which is the last layer of the hidden layer 130, may select a highest probability value among probability values passing through previous hidden layers by a softmax function, by an argmax. A return value x of the softmax function may be, for example, probability values that satisfy $0 \leq x \leq 1$. Probability values output from the softmax layer 150 may represent a probability distribution in which a sum of all probability values is "1".

For example, when "K" logits are input, the softmax layer 150 may output a probability value corresponding to each of the "K" logits. In this example, a sum of "K" probability values may be "1". Here, a "logit" may correspond to a value input to the softmax layer 150 in deep training as "a raw prediction result that is not expressed as a probability,", which may correspond to, for example, output values of the hidden layer 130.

Weighted inputs of nodes 105 from the softmax layer may be input to each of nodes 105 included in the output layer 170.

Alternatively, the neural network 100 may include a plurality of nodes 105 specialized for detection of each class. An apparatus (hereinafter, referred to as a "computing apparatus") 300 (in FIG. 3) for determining an abnormality in a manufacturing process, which will be described below, may output a final logit, which may be a probability for each class by performing a weighted summation on outputs (e.g., logits) of the plurality of nodes 105. When a width and a depth of the neural network 100 are sufficiently large, the neural network 100 may have a capacity large enough to implement a trained function with sufficient accuracy.

Although the neural network 100 described above is an example machine learning model in various embodiments, the machine learning model is not limited to the neural network 100 and may also be implemented with various structures. As a non-limiting example, the neural network 100 may correspond to a support vector machine (SVM), in addition to a deep neural network (DNN), for example, a fully connected network, a deep convolutional network, and a recurrent neural network. The SVM will be described below.

The neural network 100 may be trained by adjusting parameters of an in-training neural network toward a minimization of a loss function. The loss function may be used as an index to determine optimized parameters in the training process to generate the neural network 100. In one example, the parameters may include the weights of the in-training neural network, as well as respective biases of the nodes, hyper parameters, and the like. For example, when the neural network 100 is the resultant trained neural network, the parameters of the neural network 100 are trained parameters. In such an example, an inference operation refers to an input to the trained neural network 100 to generate an inferred output of the neural network 100.

The neural network 100 may be trained, e.g., the result of such training, to perform training on a desired task.

Accordingly, the neural network 100 may be trained to predict an anomaly using manufacturing process data labeled with a class (target class) associated with (representing) the anomaly. Parameters of the in-training neural network may be determined such that a difference between a class predicted through the neural network and a ground truth class with which training data is labeled may be minimized. Nodes 105 of layers in the in-training neural network (e.g., also represented by the neural network 100, through where the parameter weights of the connections between nodes 105 of the in-training neural network are in-training parameter weights, as a non-limiting example) may be in relationships of nonlinearly affecting each other, and values output respectively from the nodes 105 and/or other parameters of the in-training neural network associated with relationships between the nodes 105 of the in-training neural network may be optimized by learning, such as through backpropagation of the loss using gradients calculated based on the loss, e.g., gradient descent back propagation.

In an example, an operation of the training may be performed by a training device, and/or by a computing apparatus, electronic apparatus, or system discussed herein used to detect anomalies in a manufacturing process. As non-limiting examples, the training device may be a separate server from such an apparatus, electronic apparatus, or system. The training device may use previously prepared training data, or training data collected from at least one user. Alternatively, the training device may also use training data generated by a virtual metrology (VM) that will be described below.

Figure 2:
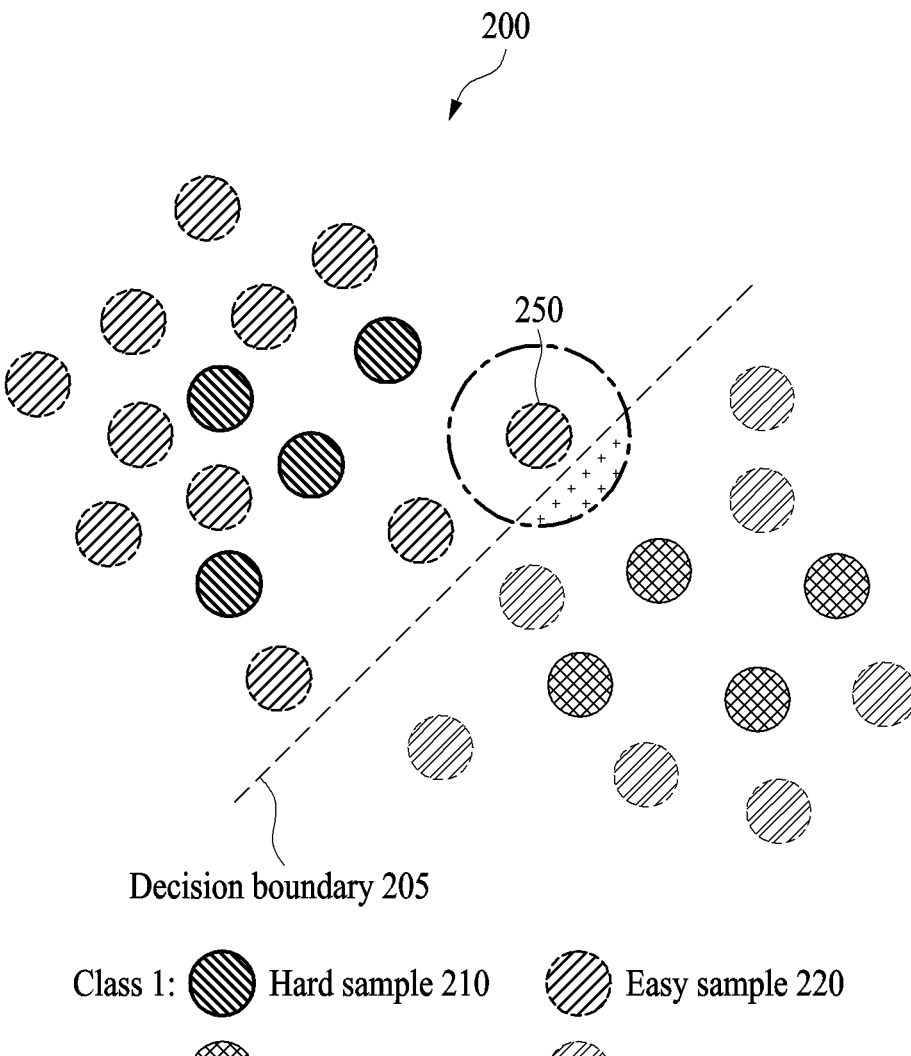
FIG. 2 illustrates an example embedded space demonstrating reliability overestimation while performing a classification using a softmax function according to one or more embodiments.

FIG. 2 illustrates an example embedded space demonstrating reliability overestimation while performing a classification using a softmax function of the machine learning model. Referring to FIG. 2, a classification situation 200 includes differently classified samples in the embedded space when reliability overestimation occurs. Here, the embedded space may correspond to a relatively low-dimensional space that may result from a transform of a high-dimensional vector. Semantically similar inputs may be close to each other in the embedded space, and semantically different inputs may be spaced apart from each other in the embedded space.

If a relatively high anomaly detection probability is estimated by a logit value that is based on the softmax function in the machine learning model, reliability overestimation may occur. Due to reliability overestimation, accuracy and performance may decrease when an anomaly detection is actually performed.

Hard samples 210 and 230 shown in the classification situation 200 may be samples that are difficult to be labeled (e.g., between a first class and a second class) due to an ambiguous classification result. Easy samples 220 and 240 may be samples that are easy to be labelled due to a clear classification result. Hereinafter, such "labeling" of inferred information generated by a machine learning model (e.g., as a result of the machine learning model or as an internal inference of the machine leaning model) is differentiated from "labeled" training data that may have been used to train the machine learning model.

For example, Class 1 and Class 2 may correspond to two respective classes of samples that are partitioned by a decision boundary (or hyperplane) 205. As shown in FIG. 2, in the example classification situation 200, the decision boundary 205 may be used as a criterion to determine samples of Class 1 or Class 2, such that Class 1 of samples are present at a left/upper side of the decision boundary 205, whereas Class 2 of samples are present at a right/lower side of the decision boundary 205. In this example, an anomaly detection probability for the hard samples 210 and 230 may be estimated to be close to a value of "0.5", thus the hard samples 210 and 230 should have been present near the decision boundary 205, and the easy samples 220 and 240 should have been present at positions far from the decision boundary 205.

However, when reliability overestimation occurs, an actual anomaly detection probability of the hard samples 210 and 230 may not be estimated to be close to the value of "0.5", but the easy samples 220 and 240 may be randomly present near the decision boundary 205, as shown in FIG. 2. As a result, one or more (e.g., an easy sample 250 in a circle) of the easy samples 220 may be incorrectly classified as Class 2 even though the one or more of the easy samples 220 clearly belongs to Class 1.

In an example, easy samples 220 and 240 that should be clearly alternately classified may be moved to positions farther from the decision boundary 205 by readjusting a classification condition by reflecting a classification criterion of an expert (i.e., an expert classification criterion) and eliminating a classification error due to reliability overestimation, thereby increasing anomaly detection performance of a computing apparatus.

Figure 3:
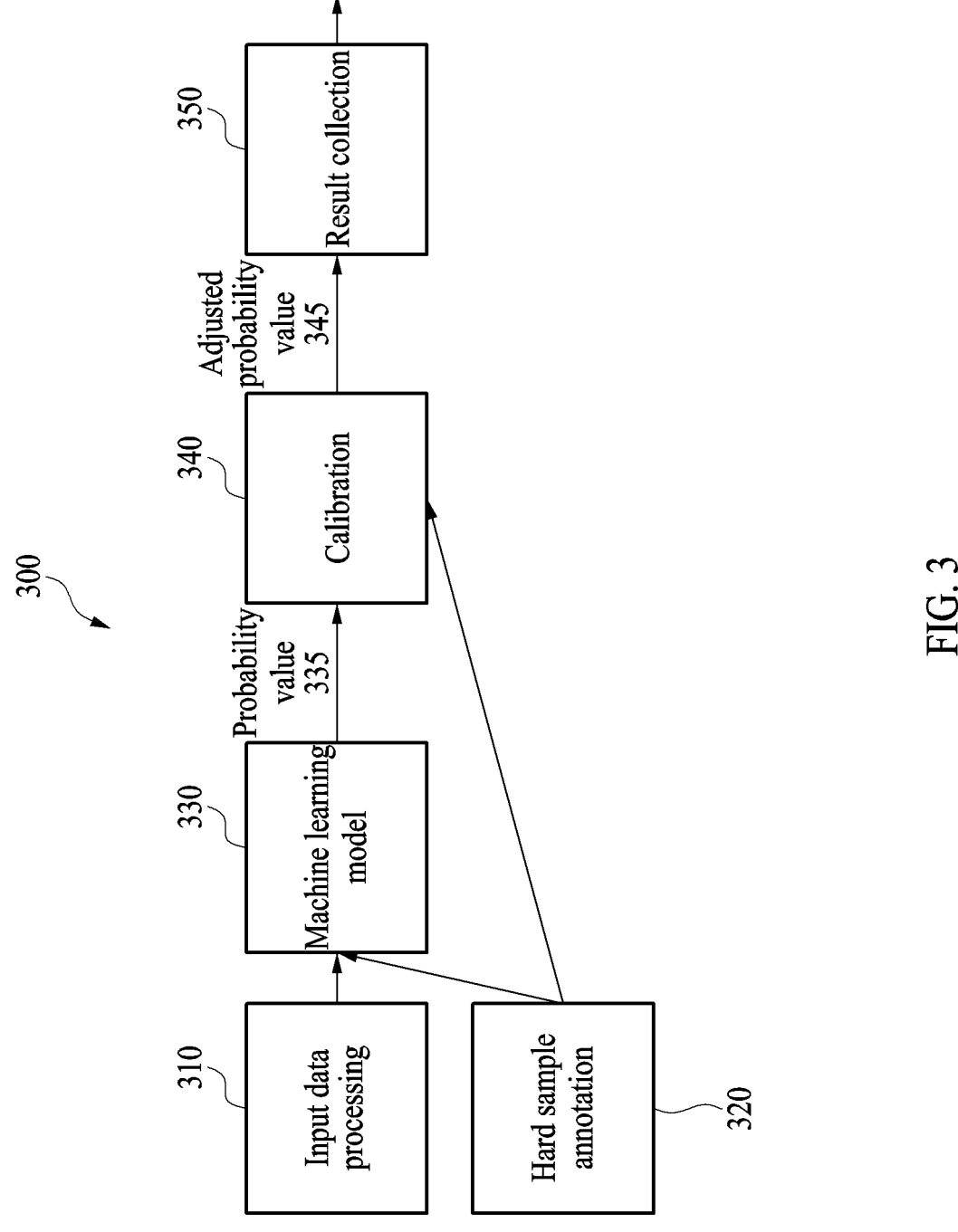
FIG. 3 illustrates an example method of determining an abnormality in a manufacturing process according to one or more embodiments.

FIG. 3 illustrates an example method of determining an abnormality in a manufacturing process. Referring to FIG. 3, an example computing apparatus 300 may perform a plurality of operations such as an input data processing operation 310, a hard sample annotation 320, a machine learning model 330, a calibration 340, and a result collection 350. Each of the illustrated operations 310, 320, 330, 340 and 350 may be representative of respective processors and memories, where the respective processors are configured to perform the corresponding operations, or representative of any various combinations of operations both processors and memories where the processors are configured to perform the respective operations.

In one example, these components of the computing apparatus 300 may be separately constructed and configured to perform respective functions. Moreover, the computing apparatus 300 may be an electronic device including one or more processors configured to execute instructions and one or more memories storing the instructions. Accordingly, when a product is actually implemented, the execution of the instructions by the one or more processors may configure the computing apparatus 300 to process any one or any combinations of the operations or methods described herein.

The input data processing operation 310 may include collection of manufacturing process data associated with the manufacturing process and performance of pre-processing on the collected manufacturing process data. The manufacturing process data may include various sensing data (as further described below) captured by sensors (e.g., cameras) configured to monitor the manufacturing process and communicate with the computing apparatus 300 or a communication system including sensors and configured to communicate with the computing apparatus 300, through use of a network as a non-limiting example.

In one example, the manufacturing process data may be data generated in respective processes of a time-series manufacturing process and may be provided in the form of a log, a map, a table, or a list, for example. However, examples are not limited thereto. The manufacturing process data may include, for example, at least one of sensing data, which is associated with at least one of an operating state of manufacturing equipment, a phenomenon represented by the manufacturing equipment, or an output of the manufacturing equipment and which is generated in a process in which the manufacturing equipment performs the manufacturing process in time series, specification (spec) data, or VM data associated with the manufacturing process, but is not limited thereto.

The spec data may be, for example, data representing an upper limit and/or a lower limit of sensing data of sensors. The spec data may also be referred to as "operating condition data".

The manufacturing process data may be, for example, real-time fault detection and classification (hereinafter, referred to as "FDC") data and/or VM data, but is not limited thereto. The FDC data may correspond to result data obtained by detecting an anomaly in a process through monitoring and analyzing of sensor data of manufacturing equipment in real time in the semiconductor manufacturing industry, by identifying an anomaly that occurs, and by sensing and monitoring a fault of equipment in real time. The VM data may be data based on a big data technique that may be applicable in the manufacturing process, and may correspond to a measurement value predicted based on sensor data of manufacturing equipment generated in the manufacturing process. The VM data may be used to monitor the manufacturing process, and data deviating from consistency among the VM data may be detected as an anomaly.

The preprocessing operation may correspond to a process of converting the manufacturing process data to a test sample in the form of an image, as a non-limiting example. The input data processing operation 310 may provide the test sample in the form of the image to the machine learning operation 330. Since the input data processing operation 310 performs preprocessing, the input data processing operation 310 may also be called a preprocessing operation.

The hard sample annotation 320 may store hard samples that include ambiguous labeling. That is, hard samples are samples that are difficult to be labelled by reflecting/satisfying a classification criterion (e.g., a labeling criterion) of an expert. Hereinafter, hard samples may be samples classified into a sample group in which these hard samples are difficult to label according to a classification criterion of an expert. The hard sample annotation 320 may generate and transfer information on the hard samples classified according to the classification criterion of the expert to the machine learning model 330 and/or the calibration 340.

The machine learning model 330 may calculate a probability value 335 (e.g., a logit value) that the test sample corresponds to a predetermined class. The predetermined class may be, for example, a target class corresponding to an anomaly that occurs in the manufacturing process. The machine learning model 330 may be a training model, for example, a neural network classifier with a neural network structure, for example, a convolutional neural network (CNN). Alternatively, the training model 330 may be an SVM.

In an example, if the machine learning model 330 includes a classifier with a structure of a CNN, the machine learning model 330 may receive, as an input, the test sample from the input data processing operation 310 and may output a logit value 335, which may be calculated in a softmax layer at a last end of hidden layers of the machine learning model 330. The machine learning model 330 may determine the abnormality in the manufacturing process based on the probability value 335 that the test sample corresponds to an anomaly occurring in the manufacturing process.

In another example, if the machine learning model 330 includes a support vector machine (SVM), the SVM may correspond to a model that defines a decision boundary (e.g., the decision or hyperplane boundary 205 in FIG. 2), namely, a model that defines a baseline for a classification of data (e.g., samples). If new unclassified data (e.g., a test sample) is input, the SVM may determine a side of a boundary to which corresponding data belongs. For example, when input data belongs to one of a first class and a second class, the decision boundary may be in the form of a baseline for distinguishing between the first class and the second class. In this example, the decision boundary may be found so as to be as far away as possible from a sample group corresponding to each class, which may be advantageous to accurately classify data. In the SVM, a support vector may be outermost data (or samples) in a corresponding data group, and data (samples) corresponding to the support vector may function to define a decision boundary. Here, a distance between the decision boundary and the support vector may be called a "margin", and the SVM may find an optimized or optimal decision boundary toward maximization or that maximizes the margin. In addition, a value of the support vector that maximizes the margin may correspond to the optimized or optimal decision boundary.

When the machine learning model 330 includes an SVM, fast learning may be achieved by training the machine learning model 330 by properly selecting some data (samples) corresponding to support vectors even though all of the training data may not be used. In addition, a same or similar result may be obtained compared to using all of the training data.

The computing apparatus 300 may calculate a probability that the test sample corresponds to a target class corresponding to the anomaly, using the machine learning model 330. For example, the machine learning model 330 may output a probability that the test sample belongs to each of a first class to an n-th class which represent anomalies. For example, when a plurality of classes representing anomalies, such as an average value shift, a value drift, a multi value, and hunting, is present, the machine learning model 330 may calculate probabilities that the test sample corresponds to each of the classes. The machine learning model 330 may output a highest probability value among the calculated probabilities. In this example, the highest probability value may be a probability value 335 corresponding to a target class to which the corresponding test sample belongs.

In addition, sensor data that is regarded to be important for each manufacturing process may be different in a shape or a form thereof, and accordingly weights of probabilities for each class may need to be adjusted. The computing apparatus 300 may predict an anomaly in time-series equipment data by adjusting a probability weight for each class based on a predetermined criterion.

The calibration 340 may calibrate a probability value 335 calculated by the machine learning model 330 by reflecting the classification criterion of the expert (i.e., expert classification criterion predetermined before the operation/implementation of the machine learning model 330). The calibration 340 may adjust the probability value 335 corresponding to the test sample to be less than probability values of the hard samples based on a distance between the test sample and samples classified as hard samples through the hard sample annotation 320 according to the classification criterion of the expert. Here, allowing a probability value 335 corresponding to a test sample to be less than probability values of hard samples may indicate reducing a probability that the test sample is classified into a class corresponding to an anomaly. An example in which the calibration 340 calibrates a probability value 335 will be further described below with reference to FIG. 4.

An adjusted probability value 345 (calibrated-logit), which is adjusted by the calibration 340, may be provided to the result collection 350.

The result collection 350 may store and/or output an abnormality detection result of each test sample using the adjusted probability value 345 adjusted by the calibration 340.

The computing apparatus 300 may detect an anomaly occurring in the manufacturing process by monitoring a state of one or more pieces of equipment constituting the manufacturing process through the above-described process. If the manufacturing process is a semiconductor manufacturing process, an anomaly in the semiconductor manufacturing process may include, for example, an error in a thickness of a thin film, an error in a width of a critical line, a misalignment of a critical line, an error in a concentration of implanted ions and ion distribution, and/or a pattern defects, as non-limiting examples.

The semiconductor manufacturing process may include a pre-process (front-end process) of fabricating an electric circuit of a semiconductor device on a silicon disk and a post-process (rear-end process) of inspecting electrical characteristics of a manufactured semiconductor device.

For example, in a pre-semiconductor process, a pattern defect inspection may be performed to detect if particles and pattern defects occur in a process of forming an electric circuit using a wafer. The pattern defect inspection in the pre-semiconductor process may include one or more operations of detecting a difference by comparing a captured image of a circuit formed on a surface of the wafer to the same repeated image. Since the difference is detected through a comparison between images, the pattern defect inspection in the pre-semiconductor process may be performed by the machine learning model 330.

The pre-process of the semiconductor manufacturing processes may include one or more processes: a thin film process of depositing a thin film, on which an electric circuit of a semiconductor device is to be printed, on a surface of a wafer, an implantation process of implanting a dopant into the deposited thin film, a diffusion process of applying heat to the implanted dopant such that the dopant is distributed on the thin film, a lithography process of coating a surface of the thin film with a photoresist to transfer a circuit pattern prefabricated on a reticle or mask to the surface of the thin film, performing an exposure to the photoresist applied onto the surface of the thin film, removing the exposed photoresist, and performing developing, an etching process of removing an exposed film using the photoresist remaining after the removing as a protective film, a cleaning process of removing the remaining photoresist and removing additionally formed foreign materials, a deposition process of forming a thick film to protect and insulate a circuit pattern of the electrical circuit, a planarization process of planarizing the deposited thick film, a metrology process of measuring at least one of a size of the circuit pattern, a thickness of the circuit pattern, or a dopant concentration, and an inspection process of inspecting particles and a pattern defect caused by a fault. The above-described pre-semiconductor processes may be performed, for example, in time series, sequentially, or any suitable order that may optimize an abnormality detection method according to one or more embodiments.

In addition, the computing apparatus 300 may include tens to hundreds of sensors and may store sensor values at the same time intervals while a wafer is being input/output. The computing apparatus 300 may sense a minute change in which the sensor values differ from a past occurrence history, detect an anomaly occurring in a process step, and determine an integrity of each process step in a non-destructive/indirect manner.

Although a method of determining an abnormality that may occur in the semiconductor manufacturing process is described as an example herein for convenience of description, the method for determining an abnormality in a manufacturing process may also be applied to various manufacturing processes of using equipment sensors, in addition to the semiconductor manufacturing process.

Figure 4:
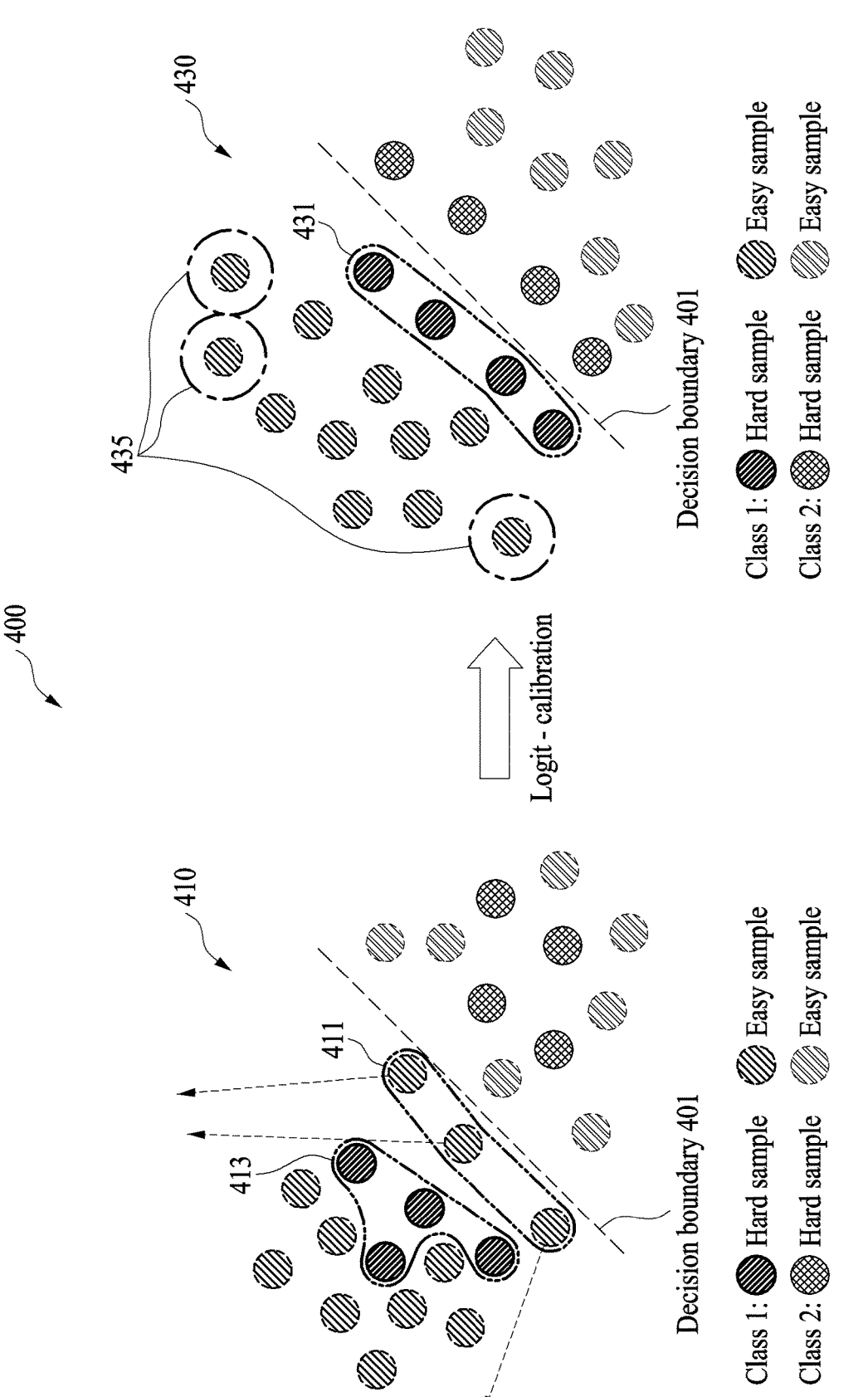
FIG. 4 illustrates an example method of adjusting a probability value according to one or more embodiments.

FIG. 4 illustrates an example operation of adjusting a probability value. Referring to FIG. 4, in the example operation 400, a classification condition of samples is readjusted by reflecting a classification criterion of an expert.

The classification condition includes an arrangement state 410 of samples in an embedded space before the operation 400 adjusts the samples, and an arrangement state 430 of the samples in the embedded space after the operation 400 adjusts the samples.

In FIG. 4, samples classified as hard samples and/or easy samples according to the classification criterion of the expert may be pre-stored in each sample list.

As described above, a computing apparatus may prevent reliability overestimation by spacing easy samples that are clearly classified among test samples far apart from a decision boundary 401 as shown in the arrangement state 430.

In an example, the computing apparatus may space easy samples 411 far apart from the decision boundary 401 similarly to easy samples 435 shown in the arrangement state 430, by adjusting or calibrating a probability value of a test sample using hard samples 413 in the embedded space as shown in the arrangement state 410, and may allow the hard samples 413 to be positioned adjacent to the decision boundary 401 as shown in the arrangement state 430.

First, the computing apparatus may distinguish between easy samples and hard samples using a training sample (or training data)

$$D_{tr} = \{x_i^{tr}, y_i^{tr}\}_{i=1}^{n_{tr}}$$

for training a machine learning model and a test sample (or test data)

$$D_{te} = \{x_i^{te}\}_{i=1}^{n_{te}}.$$

Here, $n_{tr}$ denotes a number of training samples, $$x_i^{tr}$$

denotes an input training sample, and $$y_i^{tr}$$

denotes a label corresponding to an input training sample. In addition, $n_{te}$ denotes a number of test samples, $$x_i^{te}$$

and denotes an input test sample that does not include a label.

The computing apparatus may adjust a probability value based on information on hard samples $$D_h = \{x_1^h, y_i^h\}_{i=1}^{n_d}$$

that are data selected according to a classification criterion of an expert and difficult to be classified. Here, $n_d$ denotes a number of hard samples. In addition, $$x_i^h$$

denotes input hard samples, and $$y_i^h$$

denotes labels corresponding to the input hard samples.

Hereinafter, for convenience of description, a binary class may be assumed, and a logit value may be assumed as a higher probability value between probability values corresponding to two classes calculated by a softmax layer (or softmax function).

The computing apparatus may set a threshold such that a hard sample $$D_h = \{x_i^h, y_i^h\}_{i=1}^{n_d}$$

that is data difficult to be classified during training of a machine learning model may be close to the decision boundary 401 to some extent (e.g., a threshold) even during the training. Here, the threshold may be adjusted according to a difficulty in classifying the hard samples by the expert.

For example, if the threshold is set to "0.55", a training loss of the machine learning model may be expressed as shown in Equation 1 below.

Equation 1

$$Loss = \sum_{i=1}^{n_d} D\left(\text{softmax}\left(f(x_i^h), 0.55\right) + \sum_{i=1}^{n_{tr}} CE(\text{softmax}\left(f(x_i^h)\right), y_i^{tr}\right)$$

In Equation 1, f denotes all layers other than a softmax layer (function) among layers of the machine learning model. D denotes an arbitrary function representing a distance. CE denotes a cross-entropy function.

$$\sum_{i=1}^{n_d} D\left(\text{softmax}\left(f\left(x_i^h\right), 0.55\right),\right.$$

which is a first term on the right hand side in Equation 1, denotes a loss (first loss) based on a distance between the set threshold of "0.55" and a probability value corresponding to a test sample in the embedded space, and may function to allow a logit value of the hard samples to be close as possible to the threshold of "0.55".

In addition, $$\sum_{i=1}^{n_{tr}} CE\left(\text{softmax}\left(f\left(x_i^h\right)\right), y_i^{tr}\right),$$

which is a second term on the right hand side in Equation 1, denotes a loss (second loss) based on cross entropy between a target class (target label) predicted by the machine learning model and a ground truth class (ground truth label), and may function to determine whether classes (labels) are accurately classified.

If the abnormality in the manufacturing process is determined using the machine learning model trained by the training loss of Equation 1, the computing apparatus may adjust a probability value based on a distance in the embedded space between a test sample and hard samples classified according to the classification criterion of the expert.

The computing apparatus may calculate a probability value (logit) of the test sample. Here, the probability value of the test sample may correspond to a higher probability value between the probability values corresponding to the two classes. The probability value of the test sample may belong to [0.5, 1], that is, values are between "0.5" and "1".

The computing apparatus may map probability values corresponding to the hard samples and the probability value of the test sample to the embedded space, using a mapping function. In an example, by adjusting or calibrating a probability value, probability values of easy samples may be greater than the threshold of "0.55" for probability values of hard samples.

If easy samples approach the decision boundary 401 in the embedded space, a distance between all the hard samples and the easy samples may decrease. If the distance between the hard samples and the easy samples decreases, a classification difficulty may increase. Various adjustment functions (calibration functions) based on the above relationship may be provided. An example of an adjustment function may be expressed as shown in Equation 2 below.

$$j^{th}\ \text{Calibrated logit} =$$
$$\max\left(1, 0.05 + \text{Existing logit} * \frac{D(g(x_i), g(x_j))}{\min_j\left(\sum_{i=1}^{n_d} D(g(x_i), g(x_j))\right)}\right)$$

Equation 2

Equation 2 may correspond to a method of calculating an adjusted probability value of a j-th test sample $j^{th}$ among test samples. In Equation 2, g denotes a function that maps test samples to the embedded space and may correspond to a portion of layers of the machine learning model.

A probability value adjusted by Equation 2 may belong to [0.55, 1], that is, values are between "0.55" and "1". Since a short distance from hard samples indicates a high probability of a test sample being included in the hard samples, the adjusted probability value may be close to a small value (e.g., "0.55") between values of "0.55" and "1".

As described above, the computing apparatus may adjust a probability value such that the probability value may increase if a distance between an input test sample and the hard samples increases, and may adjust the probability value such that the probability value may decrease if the distance between the input test sample and the hard samples decreases, thereby preventing a misclassification due to reliability overestimation.

Figure 5:
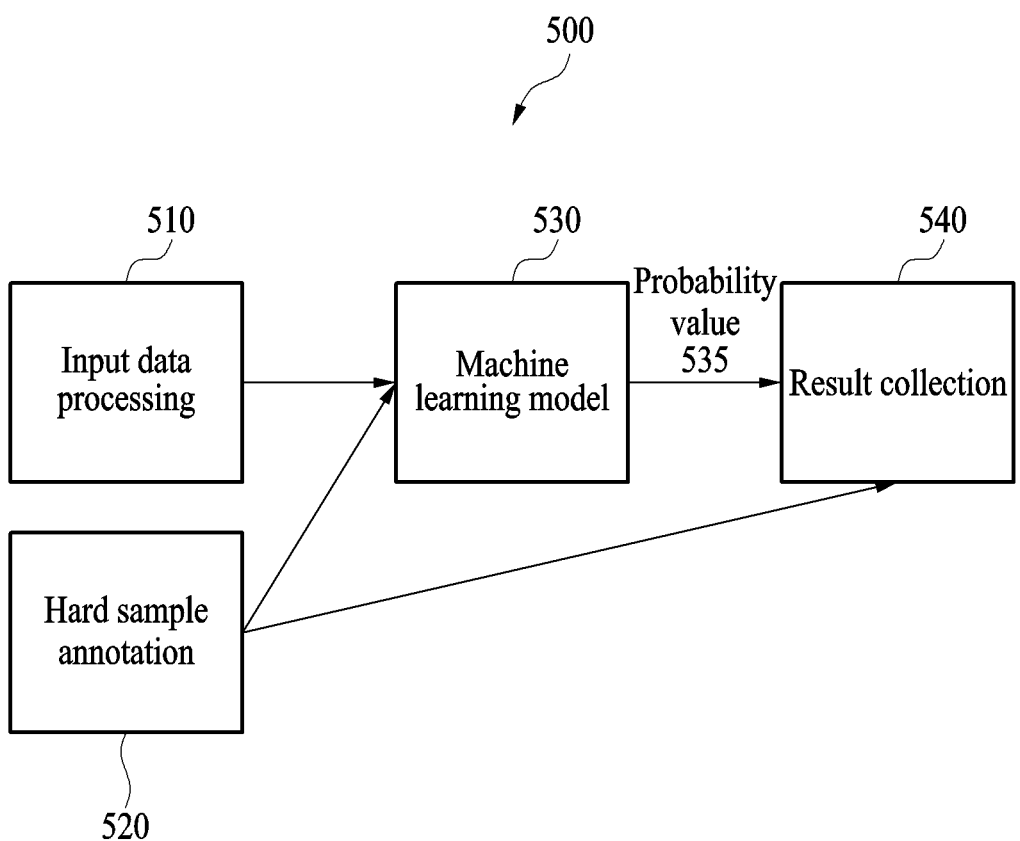
FIG. 5 illustrates an example method of determining an abnormality in a manufacturing process using a machine learning model reflecting an expert classification criterion according to one or more embodiments.

FIG. 5 illustrates an example method of determining an abnormality in a manufacturing process using a machine learning model reflecting a classification criterion of an expert according to one or more embodiments. Referring to FIG. 5, a computing apparatus 500 may include a plurality of components such as an input data processing model 510, a hard sample annotation 520, a machine learning model 530, and a result collection 540.

In the example of FIG. 5, these components of the computing apparatus 500 may be separately constructed and configured to perform respective functions. Moreover, the computing apparatus 500 may be an electronic device including one or more processors configured to execute instructions and one or more memories storing the instructions. Accordingly, when a product is actually implemented, the execution of the instructions by the one or more processors may configure the computing apparatus 500 to process any one or any combinations of the components.

Operations of the input data processing operation 510, the hard sample annotation 520, and the result collection 540 shown in FIG. 5 may be the same as those of the input data processing operation 310, the hard sample annotation 320, and the result collection 350 described above with reference to FIG. 3. The machine learning model 530 is different from the machine learning model 330 of FIG. 3, and will be described below.

The computing apparatus 500 may be configured to utilize a classification criterion of an expert directly for the machine learning model 530. In one example, unlike the calibration 340 described above with reference to FIG. 3, the computing apparatus 500 may reflect information on hard samples classified by the hard sample annotation 520 directly to the training of the machine learning model 530.

The computing apparatus 500 may configure the machine learning model 530 to generate a probability value 535 through calculation and adjustment based on a classification criterion of an expert for anomalies in the manufacturing process, by inputting the test sample to the machine learning model 530. In one example, the probability value 535 may be generated by calculating a probability value and adjusting the calculated probability value that a test sample corresponds to a target class corresponding to an anomaly occurring in the manufacturing process by reflecting a classification criterion of an expert.

Figure 6:
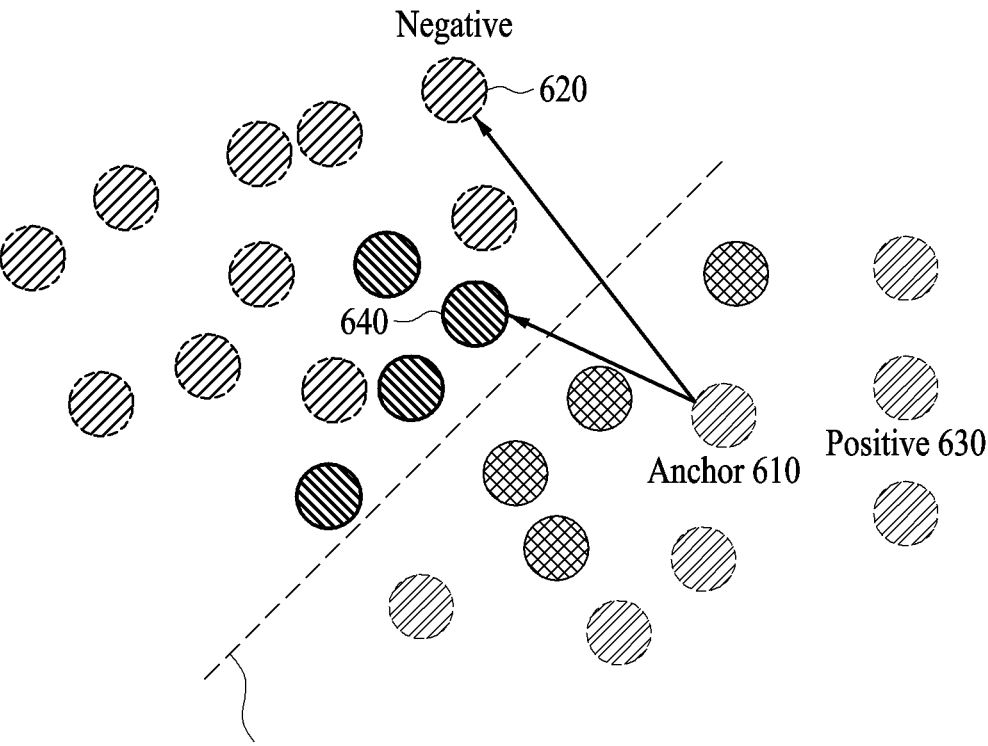
FIG. 6 illustrates an example method of training a machine learning model that reflects an expert classification criterion according to one or more embodiments.

FIG. 6 illustrates an example operation of training the machine learning model 530 of FIG. 5 such that a classification criterion of an expert is reflected according to one or more embodiments. Referring to FIG. 6, an example operation 600 is performed to reflect a classification criterion of an expert to a machine learning model (e.g., the machine learning model 530 of FIG. 5) as an example of metric learning.

The metric learning may be a training method used when a class target continues to change. In one example, the training method may employ an anchor sample 610, a hard negative sample 620, and a positive sample 630. Information of hard samples may be directly utilized for a metric learning-based loss.

In the example operation 600, samples classified as hard samples (or easy samples) according to the classification criterion of the expert may be stored in a list of hard samples (or a list of easy samples) in respective embedded spaces.

In FIG. 6, the anchor sample 610 may correspond to a training sample (or training data) actually learned by the machine learning model 530. The positive sample 630 may correspond to an easy sample belonging to the same class (or label) as that of the anchor sample 610. The hard negative sample 620 may correspond to an easy sample belonging to a different class (or label) from that of the anchor sample 610. In addition, a random negative sample 640 may correspond to one of hard samples belonging to a class (or label) different from that of the anchor sample 610.

A computing apparatus may reflect the information of the hard samples to the machine learning model by applying an additional loss according to the classification criterion of the expert to the training of the machine learning model 530.

As shown in FIG. 6, in the example operation 600, the random negative sample 640 and the hard negative sample 620 may be present for the anchor sample 610. For example, the machine learning model 530 may be trained by adding a loss to force a distance (first distance) between the anchor sample 610 and the hard negative sample 620 having a class different from the target class corresponding to the anchor sample 610 among samples included in the embedded space to be always less than a distance (second distance) between the anchor sample 610 and the random negative sample 640 that is one of hard samples classified according to the classification criterion of the expert.

As described above, if the machine learning model 530 is trained by adding a loss (third loss) to force the first distance to be less than the second distance to a training loss (first loss and/or second loss) of the machine learning model 530 such as Equation 1, the machine learning model 530 may force hard samples to be closer to a decision boundary 605 than the other samples.

Figure 7:
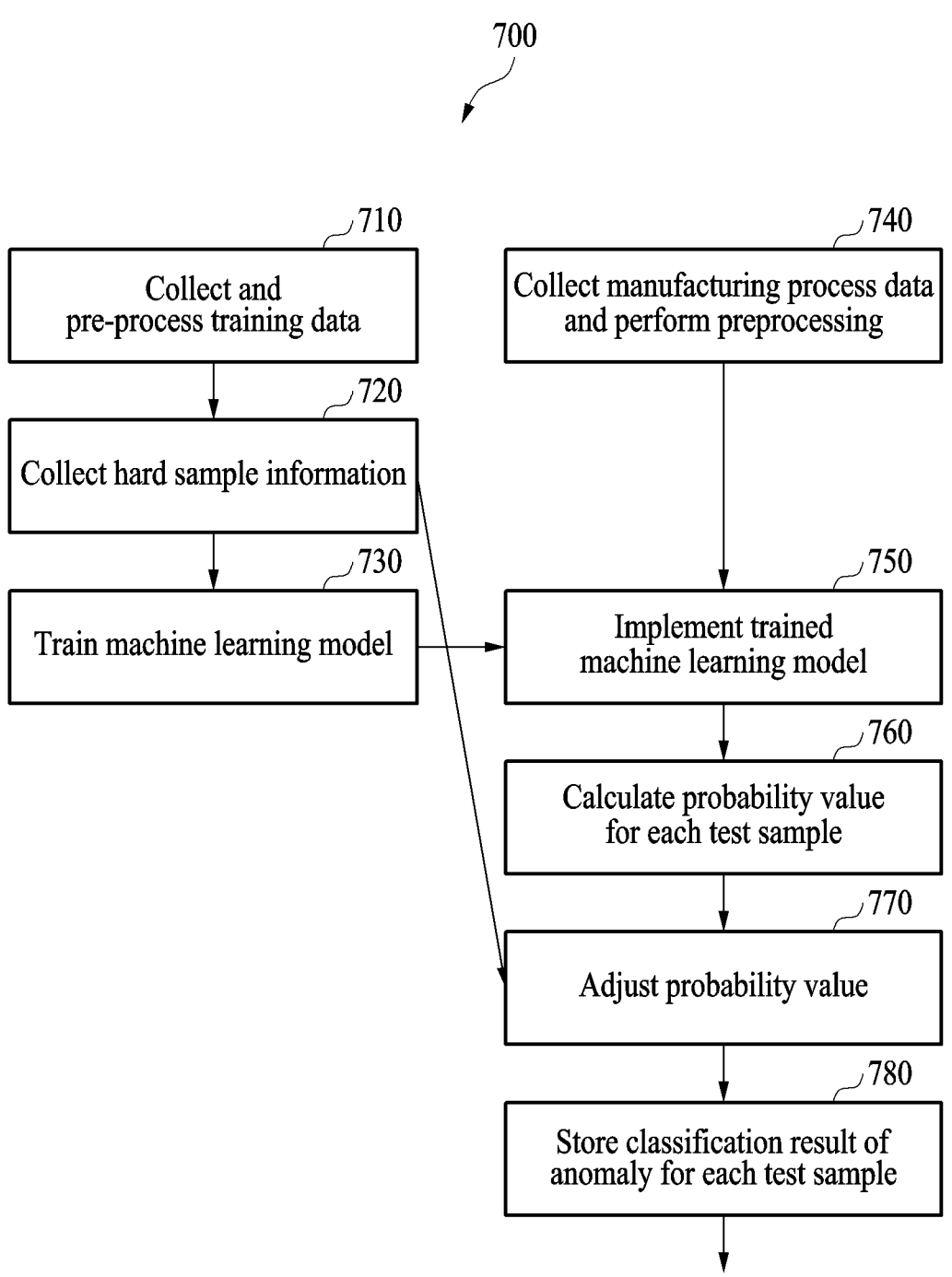
FIG. 7 illustrates example training and inference processes of a machine learning model according to one or more embodiments.

FIG. 7 illustrates an example flowchart of a training and inference process of a machine learning model according to one or more embodiments. Referring to FIG. 7, an example flowchart 700 includes a training process (e.g., operations 710 through 730) of the machine learning model, and an inference process (e.g., operations 740 through 780) using the trained machine learning model, over time.

The training process of the machine learning model may be performed by a training device. The training device may be a separate server, a separate electronic device, a separate computing apparatus. The computing apparatus, electronic device, and system discussed above and as illustrated in FIG. 13 may also be representative of the components of the training device, and may also be configured to perform the operations of the training device. In addition, the inference process using the trained machine learning model may be performed by a computing apparatus (e.g., the computing apparatus 300 of FIG. 3, the computing apparatus 500 of FIG. 5, and/or a computing apparatus 1300 of FIG. 13). The training device may include one or more processors configured to execute instructions and one or more memories storing the instructions. The execution of the instructions by the one or more processors may configure the training device to process any one or any combinations of the training and inference operations in the one or more processors.

In operation 710 of the training process, the training device may collect and pre-process a variety of training data associated with a manufacturing process through an input data pipeline such as an input data processing model (e.g., the input data processing operation 310 in FIG. 3 or 510 in FIG. 5). The training data may correspond to, for example, a variety of semiconductor process data, such as the above-mentioned FDC data or VM data, however, examples are not limited thereto. An example of preprocessed training data will be described with reference to FIG. 8 below.

In operation 720, the training device may collect hard sample information on hard samples obtained by an expert in a corresponding technical field (e.g., a semiconductor) inspecting and classifying the training data collected in operation 710 according to a classification criterion of the expert. The training device may separately store the hard sample information. An example of the hard sample information classified according to the classification criterion of the expert will be described with reference to FIG. 9 below.

In operation 730, the training device may train the machine learning model based on the training data collected in operation 710 and the hard sample information collected in operation 720. The training device may perform training by estimating parameters of the machine learning model using the training data and the hard sample information.

When the training of the machine learning model is completed performing operations 710 through 730, the computing apparatus may determine and/or store whether a test sample is abnormal by utilizing the completely trained machine learning model to monitor the manufacturing process.

The computing apparatus may determine an abnormality in the manufacturing process by classifying a test sample representing an anomaly through the inference process including operations 740 through 780 using the completely trained machine learning model.

In operation 740, the computing apparatus may collect manufacturing process data and perform a preprocessing process of converting the collected manufacturing process data to a test sample in the form of an image.

In operation 750, the computing apparatus may call the machine learning model that is completely trained through the training process.

In operation 760, the computing apparatus may calculate and generate a probability value for each test sample, using the machine learning model.

In operation 770, the computing apparatus may adjust the probability value calculated and generated in operation 760 using a calibration and the hard sample information that is collected in the training process as described above.

In operation 780, the computing apparatus may determine/identify whether the manufacturing process data is abnormal by classifying an anomaly for each test sample based on the probability value adjusted in operation 770. The computing apparatus may store a classification result of the anomaly for each test sample. The computing apparatus may more accurately determine the abnormality in the manufacturing process by classifying an anomaly of the manufacturing process data using the adjusted probability value.

FIG. 8 illustrates an example manufacturing process data converted to a test sample in the form of an image according to one or more embodiments. As shown in FIG. 8, an example test sample 800 in the form of an image may be obtained by converting manufacturing process data (e.g., VM data).

The test sample 800 may correspond to a result obtained by preprocessing VM data collected by a computing apparatus in the form of an image. The test sample 800 may be in a form of, for example, a graph image with a first axis and a second axis. The first axis may represent time, and the second axis perpendicular to the first axis may represent manufacturing process data generated or sensed in a corresponding time.

For early detection of an anomaly in a manufacturing process through a comparison between image patterns in a machine learning model, the manufacturing process data may be converted into the form of an image.

Figure 9:
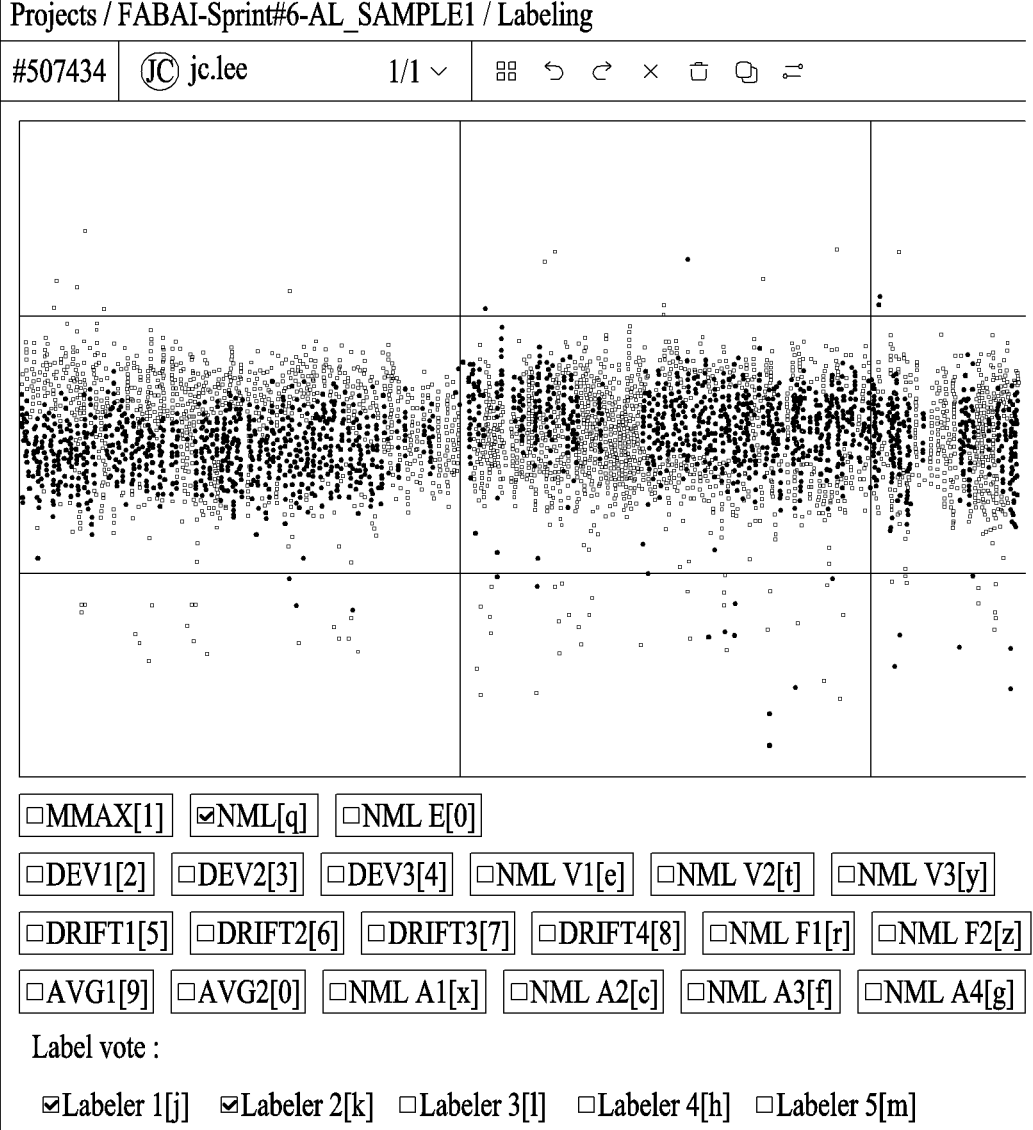
FIG. 9 illustrates an example hard samples classified according to an expert classification criterion according to one or more embodiments.

FIG. 9 illustrates an example hard samples classified according to a classification criterion of an expert. Referring to FIG. 9, the example hard samples 900 include hard samples labeled according to classification criteria of expert(s) using a labeling tool.

A computing apparatus may collect and/or store information on the hard samples labeled by expert(s) according to a classification criterion of the expert(s) using a labeling tool. Here, the collected and/or stored information on the hard samples may be used when the computing apparatus adjusts a probability value that a test sample corresponds to an anomaly in a process of determining an abnormality in a manufacturing process.

Figure 10:
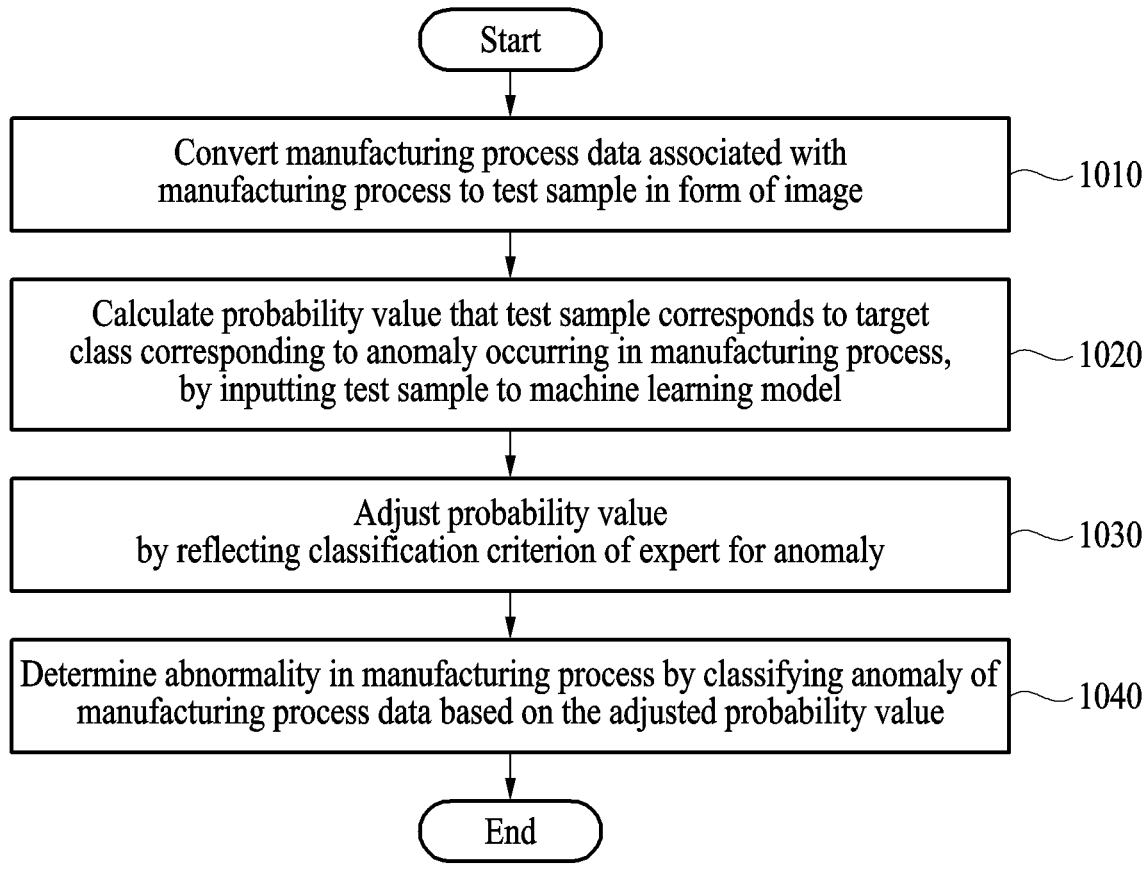
FIG. 10 illustrates an example method of determining an abnormality in a manufacturing process according to one or more embodiments.

FIG. 10 illustrates an example method of determining an abnormality in a manufacturing process according to one or more embodiments. Operations 1010 through 1040 to be described hereinafter with reference to FIG. 10 may be performed sequentially, but are not limited thereto. For example, the order of the operations may be changed and at least two of the operations may be performed in parallel, or any other order of the operations may be suitable to the example method.

Referring to FIG. 10, a computing apparatus may determine an abnormality in a manufacturing process through operations 1010 through 1040. The computing apparatus may be, for example, the computing apparatus 300 described above with reference to FIG. 3 or the computing apparatus 1300 that will be described below with reference to FIG. 13, but is not limited thereto.

In operation 1010, the computing apparatus may convert manufacturing process data associated with the manufacturing process to a test sample in the form of an image. In one example, the computing apparatus may convert the manufacturing process data to, for example, the test sample in the form of the image described above with reference to FIG. 8. The image may be stored in a memory associated with the computing apparatus.

The manufacturing process data may include, for example, at least one of sensing data, which is associated with at least one of an operating state of manufacturing equipment, a phenomenon represented by the manufacturing equipment, or an output of the manufacturing equipment and which is generated in a process in which the manufacturing equipment performs the manufacturing process in time series, spec data, or VM data associated with the manufacturing process, but is not limited thereto. The manufacturing process may correspond to, for example, a manufacturing or production process of various products in addition to the above-described semiconductor manufacturing process.

In operation 1020, the computing apparatus may calculate and generate a probability value that the test sample corresponds to a target class representing an anomaly occurring in the manufacturing process, by inputting the test sample obtained in operation 1010 to a machine learning model. In one example, the machine learning model may be trained to predict an anomaly based on manufacturing process data labeled with the target class.

The machine learning model may be trained by a loss that is based on a difference between a target class predicted by the machine learning model and a ground truth class with which the manufacturing process data is labeled. Alternatively, the machine learning model may be trained based on at least one of a first loss that is based on a distance between a probability value corresponding to a test sample in an embedded space and a set threshold, or a second loss that is based on cross entropy between the target class predicted by the machine learning model and a ground truth class corresponding to the test sample.

The machine learning model may be, for example, an SVM or a neural network classifier.

In operation 1030, the computing apparatus may adjust the probability value calculated in operation 1020, by reflecting a classification criterion of an expert for the anomaly. The computing apparatus may adjust the probability value based on a distance in the embedded space between the test sample and hard samples classified according to the classification criterion of the expert. In one example, the hard samples classified according to the classification criterion of the expert may be collected in a process of training the machine learning model and pre-stored in, for example, a memory of the computing apparatus or a cloud server. An example in which the computing apparatus adjusts a probability value will be described with reference to FIG. 11 below.

In operation 1040, the computing apparatus may determine/identify the abnormality in the manufacturing process by classifying an anomaly of the manufacturing process data based on the probability value adjusted in operation 1030. The computing apparatus may store the anomaly of the manufacturing process data classified in a memory associated with operation 1040.

FIG. 11 illustrates an example of the operation 1030 that adjusts a probability value according to one or more embodiments. The example operation 1030 may include operations 1110 through 1160, which may be performed sequentially, but are not limited thereto. For example, the order of the operations 1110 through 1160 may be changed and at least two of the operations may be performed in parallel, or any other order of the operations may be suitable to the computing apparatus/method. Referring to FIG. 11, a computing apparatus may adjust a probability value through operations 1110 through 1160.

In operation 1110, the computing apparatus may call or load hard samples classified according to a classification criterion of an expert.

In operation 1120, the computing apparatus may map the hard samples and a test sample to an embedded space, using a mapping function.

In operation 1130, the computing apparatus may calculate respective distances between first positions corresponding to the respective hard samples mapped to the embedded space in operation 1120 and a second position corresponding to the test sample.

In operation 1140, the computing apparatus may compare the respective distances calculated in operation 1130 to a threshold. The computing apparatus may determine whether a selected one of the respective distances calculated in operation 1130 is less than or equal to the threshold. In an example, when it is determined that the distance calculated in operation 1130 is less than or equal to the threshold, the computing apparatus may adjust a probability value that a test sample corresponds to a target class to be increased in operation 1150. In another example, when it is determined that the distance calculated in operation 1130 is greater than the threshold, the computing apparatus may adjust the probability value that the test sample corresponds to the target class to be reduced in operation 1160.

The computing apparatus may adjust both the probability value and the threshold that is a classification criterion for probability values. The threshold may be a probability value used as a criterion for classifying a target class corresponding to an anomaly. The computing apparatus may adjust the threshold according to a difficulty in classifying the hard samples by the expert. For example, if the difficulty in classifying the hard samples by the expert increases, the threshold may be adjusted to be reduced to a value close to a decision boundary (e.g., "0.5"). If the difficulty in classifying the hard samples decreases, the threshold may be adjusted to be increased to a value (e.g., "0.56", "0.60", etc.) greater than the decision boundary.

Figure 12:
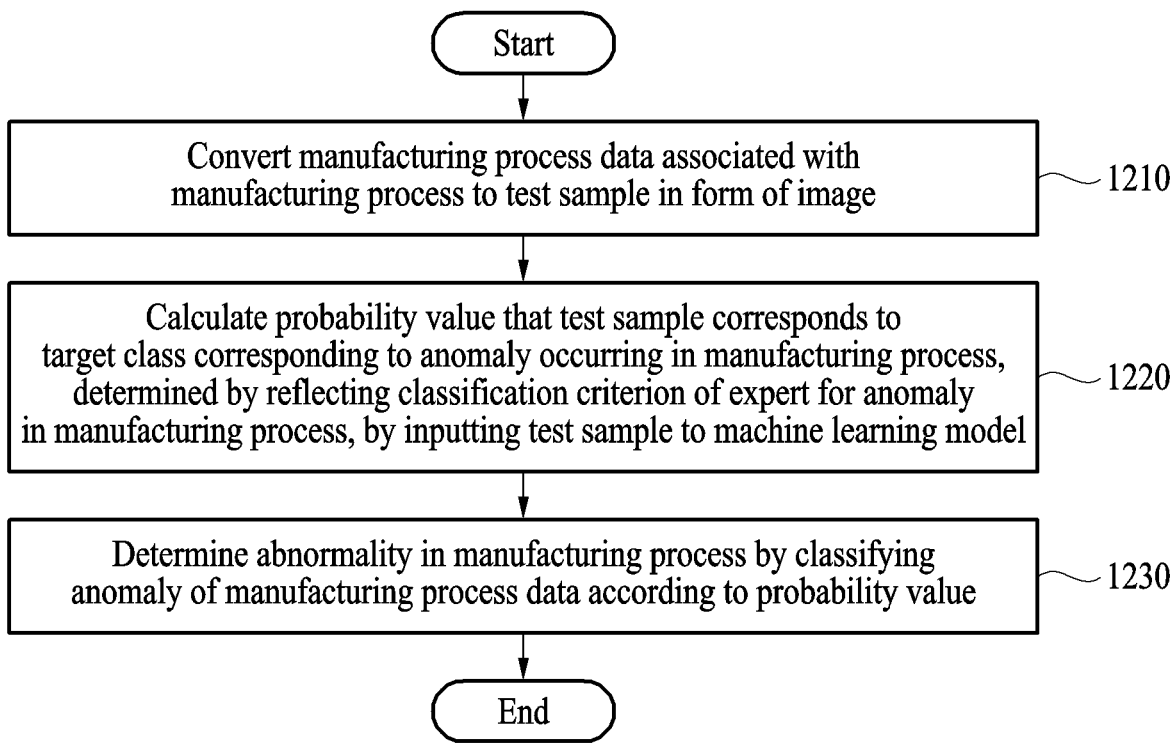
FIG. 12 illustrates an example method of determining an abnormality in a manufacturing process according to one or more embodiments.

FIG. 12 illustrates an example method of determining an abnormality in a manufacturing process according to one or more embodiments. Example operations 1210 through 1230 may be performed sequentially, but are not limited thereto. For example, the order of the operations may be changed and at least two of the operations may be performed in parallel, or any other order of the operations may be suitable to the computing apparatus/method.

Referring to FIG. 12, a computing apparatus may adjust a probability value for determining an abnormality in a manufacturing process through operations 1210 through 1230. The computing apparatus may be, for example, the computing apparatus 500 described above with reference to FIGS. 5 and 6, but is not limited thereto. The computing apparatus may include one or more processors configured to execute instructions and one or more memories storing the instructions. The execution of the instructions by the one or more processors may configure the computing apparatus to process any one or any combinations of these operations in the one or more processors.

In operation 1210, the computing apparatus may convert manufacturing process data associated with the manufacturing process to a test sample in the form of an image.

In operation 1220, the computing apparatus may calculate a probability value that the test sample corresponds to a target class representing an anomaly occurring in the manufacturing process, by inputting the test sample obtained in operation 1210 to a machine learning model. The probability value may be determined by reflecting a classification criterion of an expert for the anomaly in the manufacturing process.

For example, the machine learning model may be trained by a first loss based on a distance between a probability value corresponding to the test sample in an embedded space and a set threshold, a second loss based on cross entropy between the target class predicted by the machine training model and a ground truth class corresponding to the test sample, and a third loss to force a first distance between the test sample and a hard negative sample having a class different from the target class corresponding to the test sample among samples included in the embedded space to be less than a second distance between the test sample and a random negative sample corresponding to one of hard samples classified according to the classification criterion of the expert. The machine learning model may be trained by the process described above with reference to FIGS. 4 and 6, as a non-limiting example.

In operation 1230, the computing apparatus may determine the abnormality in the manufacturing process by classifying an anomaly of the manufacturing process data according to the probability value calculated in operation 1220.

Figure 13:
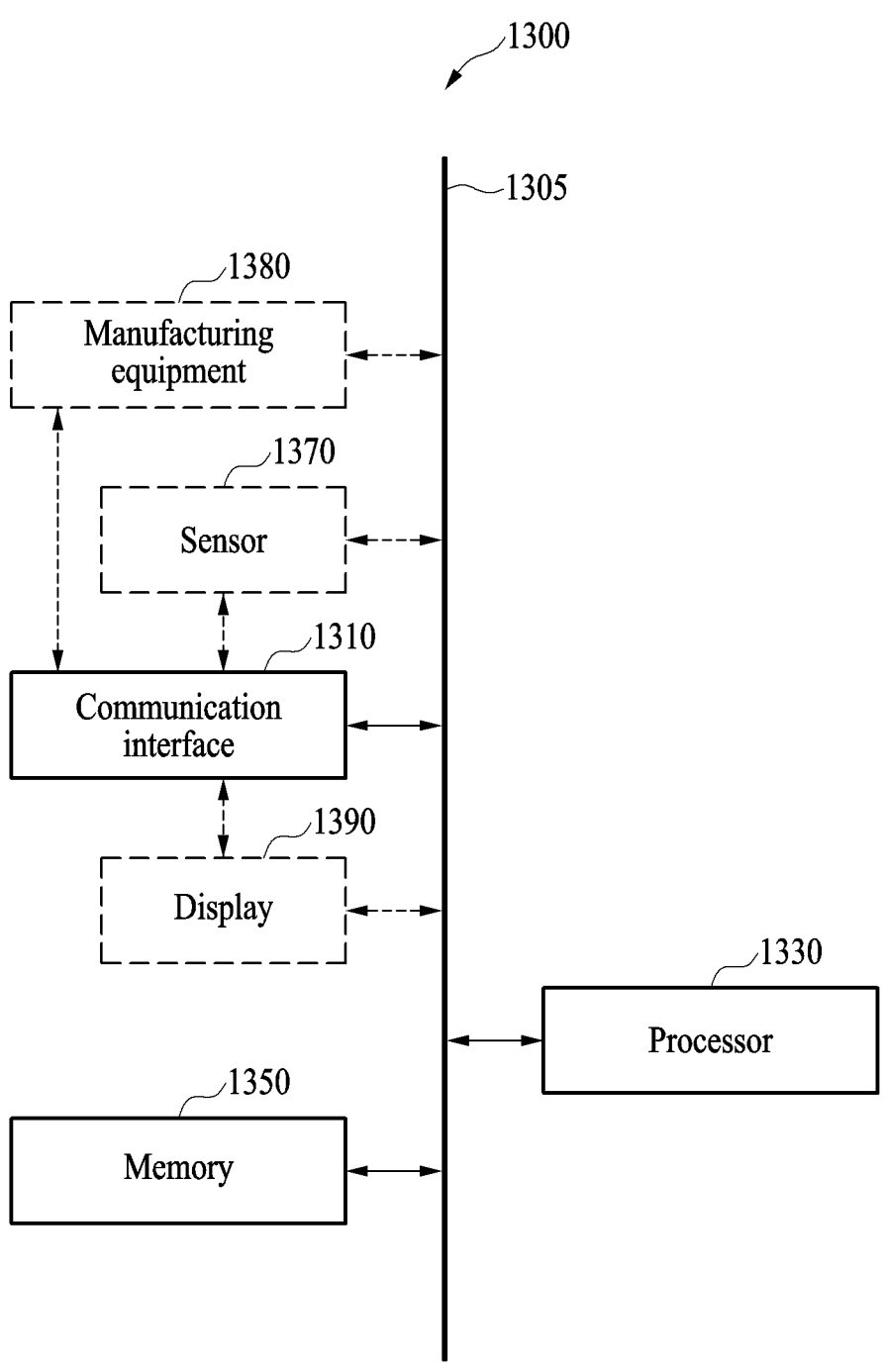
FIG. 13 illustrates an example electronic device or manufacturing system with abnormality determination in a manufacturing process of the manufacturing system according to one or more embodiments.

FIG. 13 illustrates an example computing apparatus for determining an abnormality in a manufacturing process. Referring to FIG. 13, the computing apparatus 1300 may include a communication interface 1310, a processor 1330, a memory 1350, sensors 1370 and a display 1390. The communication interface 1310, the processor 1330, the memory 1350, the sensors 1370 and the display 1390 may communicate with each other via a communication bus 1305, or a network.

The communication interface 1310 may receive manufacturing process data associated with a manufacturing process from the sensors 1370. The manufacturing process data may be sensing data captured by the sensors 1370 (e.g., cameras). The communication interface 1310 may also be configured to communicate with other exterior computers. The computing apparatus 1300 may be connected to an external device (e.g., a personal computer (PC), or a network) through the communication interface 1310 to exchange data therewith. The computing apparatus 1300 may be installed in various computing apparatuses and/or systems.

The processor 1330 may convert the manufacturing process data to a test sample in the form of an image to the communication interface 1310 to output information on detected anomalies. The processor 1330 may calculate a probability value that the test sample corresponds to a target class representing an anomaly occurring in the manufacturing process, by inputting the test sample to a machine learning model. The processor 1330 may adjust the probability value by reflecting a classification criterion of an expert for the anomaly. The processor 1330 may determine the abnormality in the manufacturing process, by classifying an anomaly of the manufacturing process data according to the adjusted probability value.

The memory 1350 may store at least one of the anomalies of the manufacturing process data classified by the processor 1330 or the hard samples classified according to the classification criterion of the expert. The memory 1350 may store the manufacturing process data received through the communication interface 1310 and the test sample obtained by converting the manufacturing process data by the processor 1330. In addition, the memory 1350 may store at least one program and/or a variety of information generated in a processing process of the processor 1330. In addition, the memory 1350 may store a variety of data and programs. The memory 1350 may include, for example, a volatile memory or a non-volatile memory. The memory 1350 may include a high-capacity storage medium such as a hard disk to store a variety of data.

The computing apparatus 1300 may display identified abnormalities on the display 1390.

In addition, the processor 1330 may be configured to perform any combinations of, or all, operations or methods described above with reference to FIGS. 1 through 12. In an example, the processor 1330 may execute computer readable instructions (or code) stored in the memory 1350 to configure the processor 1330 to perform any combinations of, or all, operations or methods described above with reference to FIGS. 1 through 12.

The processor 1330 may be a hardware-implemented electronic device having a physically structured circuit to execute desired operations. The desired operations may include, for example, codes or instructions stored in the memory 1350. The code or instructions may be included in a program at least partially stored in the memory 1350. The hardware-implemented computing apparatus 1300 may include, for example, a microprocessor, a central processing unit (CPU), a graphics processing unit (GPU), a processor core, a multi-core processor, a multiprocessor, an application-specific integrated circuit (ASIC), a field-programmable gate array (FPGA), and a neural processing unit (NPU).

The processors, memories, electronic devices, apparatuses, electronic devices 100 and 1000, and other apparatuses, devices, units, modules, and components described herein with respect to FIGS. 1-13 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A processor-implemented method of an apparatus or system, comprising:
obtaining an expert classification criterion from a memory of the apparatus or system;
converting manufacturing process data associated with a manufacturing process to a test sample in a form of an image;
generating, using a machine learning model provided with the test sample, a probability value that the test sample corresponds to a target class representing an anomaly occurring in the manufacturing process;
adjusting the probability value by reflecting the expert classification criterion for the anomaly; and
identifying, by classifying the anomaly based on the adjusted probability value, whether a final abnormality in the manufacturing process has occurred.

2. The method of claim 1, wherein the adjusting of the probability value comprises adjusting the probability value based on respective distances in an embedded space between the test sample and hard samples classified according to the expert classification criterion.

3. The method of claim 2, wherein the hard samples classified according to the expert classification criterion are stored in advance.

4. The method of claim 2, wherein the adjusting of the probability value comprises:
mapping the hard samples and the test sample to the embedded space using a mapping function; and
adjusting the probability value based on respective distances between first positions corresponding to the respective hard samples in the embedded space and a second position corresponding to the test sample.

5. The method of claim 4, wherein the adjusting of the probability value comprises:
adjusting a corresponding probability value such that the corresponding probability value increases, in response to a corresponding one of the distances being less than or equal to a threshold; and
adjusting the corresponding probability value such that the corresponding probability value decreases, in response to the corresponding one of the distances being greater than the threshold.

6. The method of claim 5, wherein the threshold is adjustable according to a difficulty in classifying the hard samples by the expert.

7. The method of claim 1, wherein the machine learning model is trained to predict the anomaly based on the manufacturing process data labeled with the target class.

8. The method of claim 1, wherein the machine learning model is trained based on at least one of:
a first loss based on a distance between a training probability value corresponding to a training test sample in an embedded space and a set threshold; or
a second loss based on cross entropy between the target class representing a training anomaly predicted by the in-training machine learning model and a ground truth class corresponding to the test sample.

9. The method of claim 1, wherein the manufacturing process data comprises at least one of:
sensing data, representing at least one of an operating state of manufacturing equipment, a phenomenon represented by the manufacturing equipment, or an output of the manufacturing equipment and which is generated in a process in which the manufacturing equipment performs the manufacturing process in time series; or
virtual metrology data representing the manufacturing process.

10. The method of claim 1, further comprising:
storing the classified anomaly of the manufacturing process data in the memory.

11. The method of claim 1, wherein the machine learning model comprises at least one of a support vector machine (SVM) or a neural network classifier.

12. The method of claim 1, wherein the manufacturing process data comprise semiconductor manufacturing process data from one or more of:
a thin film process of depositing a thin film, on which an electric circuit of a semiconductor device is to be printed, on a surface of a wafer;
an implantation process of implanting a dopant into the deposited thin film;
a diffusion process of applying heat to the implanted dopant such that the dopant is distributed on the thin film;
a lithography process of coating a surface of the thin film with a photoresist to transfer a circuit pattern prefabricated on a reticle or mask to the surface of the thin film, performing an exposure to the photoresist applied onto the surface of the thin film, removing the exposed photoresist, and performing developing;
an etching process of removing an exposed film using the photoresist remaining after the removing as a protective film;
a cleaning process of removing the remaining photoresist and removing additionally formed foreign materials;
a deposition process of forming a thick film to protect and insulate a circuit pattern of the electrical circuit;
a planarization process of planarizing the deposited thick film;
a metrology process of measuring at least one of a size of the circuit pattern, a thickness of the circuit pattern, or a dopant concentration; or
an inspection process of inspecting particles and a pattern defect caused by a fault.

13. A non-transitory computer-readable storage medium storing instructions that, when executed by one or more processors, cause the one or more processors to perform the method of claim 1.

14. A processor-implemented method of an apparatus or system, comprising:

obtaining an expert classification criterion from a memory of the apparatus or system;

converting manufacturing process data associated with a manufacturing process to a test sample in a form of an image;

generating, using a machine learning model provided with the test sample and based on the expert classification criterion for an anomaly in the manufacturing process, a probability value that the test sample corresponds to a target class representing the anomaly; and identifying, by classifying the anomaly based on the generated probability value, whether a final abnormality in the manufacturing process has occurred.

15. The method of claim 14, wherein the machine learning model is an in-training model, and the method further comprises:

training the in-training model based on:

a first loss based on a distance between a probability value corresponding to the test sample in an embedded space and a set threshold;

a second loss based on cross entropy between the target class representing the anomaly predicted by the machine learning model and a ground truth class corresponding to the test sample; and a third loss to force a first distance between the test sample and a hard negative sample having a class different from the target class corresponding to the test sample among samples included in the embedded space to be less than a second distance between the test sample and a random negative sample corresponding to one of hard samples classified according to the classification criterion of the expert.

16. An apparatus, comprising:

one or more processors configured to:

convert manufacturing process data to a test sample in a form of an image;

generate, using a machine learning model provided with the test sample, a probability value that the test sample corresponds to a target class representing an anomaly occurring in the manufacturing process;

adjust the probability value based on a classification criterion of an expert for the anomaly; and identify, by classifying the anomaly based on the adjusted probability value, whether the abnormality in the manufacturing process has occurred.

17. The apparatus of claim 16, wherein the one or more processors are configured to adjust the probability value based on respective distances in an embedded space between the test sample and respective hard samples classified based on the classification criterion of the expert.

18. The apparatus of claim 17, further comprising:

one or more memories configured to store at least one of the classified anomalies of the manufacturing process data or the hard samples classified based on the classification criterion of the expert.

19. The apparatus of claim 17, wherein the one or more processors are configured to:

map the test sample to the embedded space using a mapping function;

adjust the probability value such that the probability value increases, in response to a distance between a selected one of first positions corresponding to a selected one of the hard samples in the embedded space and a second position corresponding to the test sample being less than or equal to a threshold; and adjust the probability value such that the probability value decreases, in response to the distance being greater than the threshold.

20. The apparatus of claim 19, wherein the machine learning model is trained to predict the anomaly based on the manufacturing process data labeled with the target class.

* * * * *